United States Patent
Wang et al.

(10) Patent No.: US 8,801,947 B2
(45) Date of Patent: Aug. 12, 2014

(54) METHODS FOR FORMING MICROLENSES

(71) Applicant: Mattson Technology, Inc., Fremont, CA (US)

(72) Inventors: Tinghao Frank Wang, Irvine, CA (US); Rao V. Annapragada, Union City, CA (US); Cecilia Laura Quinteros, Santa Clara, CA (US); Linda Nancy Marquez, San Jose, CA (US); Steven M. Kennedy, Portland, OR (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 13/903,258

(22) Filed: May 28, 2013

(65) Prior Publication Data
US 2013/0323933 A1    Dec. 5, 2013

Related U.S. Application Data

(60) Provisional application No. 61/653,181, filed on May 30, 2012.

(51) Int. Cl.
*B29D 11/00*    (2006.01)

(52) U.S. Cl.
USPC .......................................................... 216/26

(58) Field of Classification Search
CPC ........... H01L 27/14627; G02B 3/0012; G02B 26/0841; G02B 2006/12176; C03C 23/006
USPC .......................................................... 216/26
See application file for complete search history.

(56) References Cited

U.S. PATENT DOCUMENTS

| | | | |
|---|---|---|---|
| 5,948,281 A | 9/1999 | Okazaki et al. | |
| 7,303,690 B2 | 12/2007 | Amemiya et al. | |
| 7,875,196 B2 | 1/2011 | Amemiya | |
| 2001/0009177 A1 | 7/2001 | Luo et al. | |
| 2005/0061772 A1* | 3/2005 | Amemiya | 216/26 |
| 2011/0281438 A1 | 11/2011 | Lee et al. | |
| 2012/0026593 A1 | 2/2012 | Yoshimura et al. | |

FOREIGN PATENT DOCUMENTS

| | | |
|---|---|---|
| JP | 10148704 | 6/1998 |
| JP | 2002110952 | 4/2002 |

OTHER PUBLICATIONS

T. Knieling et al. "Microlens array production in a microtechnological dry etch and reflow process for display applications" J. Europ. Opt. Soc. Rap. Public. 7, 12007 (2012) Mar. 22, 2012.*
International Search Report—2 pages.

* cited by examiner

*Primary Examiner* — Roberts Culbert
(74) *Attorney, Agent, or Firm* — Dority & Manning, P.A.

(57) ABSTRACT

Methods for forming microlenses on a semiconductor substrate are provided. An inductively coupled plasma etch process using a process gas that includes a mixture of $CF_4$ and $CHF_3$ can be used to modify the lens shape of a plurality of microlens objects located on a semiconductor substrate to meet microlens specifications in terms of curvature, height, length, shape, and/or distance between adjacent microlens objects on the substrate. The inductively coupled plasma process can be performed in an inductively coupled plasma processing apparatus that includes a grounded Faraday shield to prevent any capacitive coupling during the plasma etching process to reduce sputtering of the microlens surface.

20 Claims, 7 Drawing Sheets

FIG. 9

| PROCESS TRENDS WITH CHF3/CF4 CHEMISTRY | | | | | | | |
|---|---|---|---|---|---|---|---|
| PARAMETER | BIAS POWER | SOURCE POWER | PRESSURE | $CF_4$ ADDITION[3] | $CHF_3$ ADDITION[4] | ESC TEMPERATURE | CO ADDITION |
| Max | 250Wb | 2500Ws | 40 mt | 80 sccm | 300 sccm | 40°C | 100 |
| Min | 50Wb | 600Ws | 5 mt | 20 sccm | 120 sccm | 10°C | 0 |
| UL ETCH RATE | ← | ↑[1] OR ↓[2] | → | ← | → | ← | ↑ |
| SIZE OF OPEN AREA | ← | → | → | ← | → | ← | → |

NOTE:
1: ETCH-DOMINATE MODE
2: DEPOSITION-DOMINATE MODE
3: HOLDING $CHF_3$ CONSTANT
4: HOLDING $CF_4$ CONSTANT

METHODS FOR FORMING MICROLENSES

FIELD

The present disclosure relates generally to forming microlenses, and more particularly, to a method for forming microlenses on a semiconductor substrate using an inductively coupled plasma etching process.

BACKGROUND

Microlenses can be used in a variety of applications, such as in charge coupled devices (CCD), complementary metal oxide semiconductor (CMOS) image sensors, and liquid crystal displays (LCD). Microlenses can be formed as an array of microlenses on a supporting substrate, such as a semiconductor substrate. Typical microlenses include a very small lens used to focus light onto photosensitive elements. For instance, microlenses used in CCD arrays can be used to focus light onto photosensitive components of the CCD array. Similarly, microlenses can focus light into active regions in LCDs to generate images to be projected.

Microlenses can be formed on a semiconductor substrate using a plurality of semiconductor processing techniques. In one example, microlenses can be formed using photolithography techniques. Photolithography techniques alone, however, suffer several drawbacks. For instance, with the increasing miniaturization of electronic components, the amount of light of incident onto microlens arrays is becoming increasingly smaller, leading to reduced sensitivity. To increase the light collection efficiency of the microlens array, it is desirable to increase the lens size of each microlens while at the same time decreasing the distance between microlenses in the microlens array. Photolithography techniques alone are unable to achieve a sufficient reduction in the distance between microlenses in a microlens array, particularly in the diagonal direction.

For example, FIG. 1A depicts a top view of a microlens array 20 formed using known photolithography techniques. The microlens array 20 includes a plurality of microlenses 25 separated by an x-y distance $D_1$ and a diagonal distance $D_2$. As shown, in FIG. 1B, the x-y distance $D_1$ between microlenses 25 can be reduced using a reflow process. The reflow process, however, only partially reduces the diagonal distance $D_2$. The diagonal distance $D_2$ is still large in terms of increasing the light collection efficiency of microlens arrays.

Etching techniques can be used to reduce the distance, including the diagonal distance, between microlenses in a microlens array. For example, relatively expensive etching gases, such as $SF_6$ and $C_4F_8$, have been used to form microlenses having a larger area at a higher etching rate. In addition, etching gases such as $CF_4$ in combination with other gases have also been used in capacitively coupled plasma etching processes to modify microlens shape in a microlens array. Capacitively coupled plasmas have higher plasma potential and do not provide for independent control of ion density and energy. As a result, the capacitively coupled plasmas tend to sputter the microlens surface leading to roughening of the microlens surface. The roughening of the microlens surface can cause scattering of light, reducing the light collection efficiency of the microlens.

Thus, a need exists for an improved method of forming microlenses that can increase the light collection efficiency of microlenses using more cost effective processing gases and etching tools.

SUMMARY

Aspects and advantages of the invention will be set forth in part in the following description, or may be obvious from the description, or may be learned through practice of the invention.

One exemplary embodiment of the present disclosure is directed to a method of forming microlenses on a substrate. The method includes placing a substrate having a plurality of microlens objects having a lens shape within the interior of a processing chamber of an inductively coupled plasma processing apparatus. The inductively coupled plasma processing apparatus includes at least one inductive element and a grounded Faraday shield disposed between the inductive element and the interior of the process chamber. The method further includes providing a process gas to the interior of the processing chamber. The process gas includes a mixture of $CF_4$ and $CHF_3$. The method includes energizing the at least one inductive element to generate a substantially inductive plasma within the interior of the processing chamber and performing a plasma etching process with the process gas on the substrate to modify the lens shape of the microlens objects on the substrate.

Variations and modifications can be made to this exemplary embodiment of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure, including the best mode, to one of ordinary skill in the art, is set forth more particularly in the remainder of the specification, including reference to the accompanying figures, in which:

FIG. 9 depicts the trends of changes in etching rate and distance between microlens objects at varying process parameter values for an inductively coupled plasma etching process according to an exemplary embodiment of the present disclosure.

DETAILED DESCRIPTION

Figure 1A:
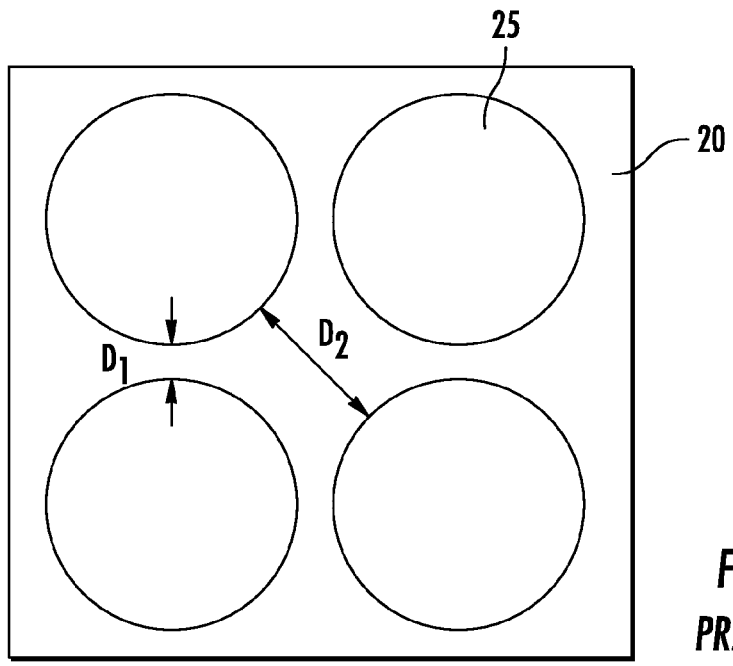
FIG. 1A depicts a top view of an exemplary microlens array formed using known photolithography techniques.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to a method for forming microlenses on a semiconductor substrate. The method includes using an inductively coupled plasma etch process to modify the lens shape of a plurality of microlens objects located on a semiconductor substrate to meet microlens specifications in terms of curvature, height, length, shape, and/or distance between adjacent microlens objects on the substrate. The etch process can be performed using an inductively coupled plasma processing apparatus to generate a reactive gas mixture. The lens shape and the distance between adjacent microlens objects can be controlled by adjusting process parameters such as the flow rates of process gases used during the etch process, RF source and bias powers, pressure within the interior of the processing chamber of the inductively coupled plasma processing apparatus, and/or other process parameters.

According to aspects of the present disclosure, a relatively simple and inexpensive process gas can be used during the inductively coupled plasma etch process, such as a process gas that includes a mixture of $CF_4$ and $CHF_3$. The process gas can further include one or more of $O_2$, Ar, CO, or $N_2$ in addition to the $CF_4$ and $CHF_3$. The use of a simple process gas, such as a process gas including a mixture of $CF_4$ and $CHF_3$, provides for more efficient dissociation of the process gas during the inductively coupled plasma etch process into ions and radicals that modify the shape of microlens objects on the semiconductor substrate.

The use of an inductively coupled etch process also provides for improved independent control of ion energy and ion density during the plasma etch process. For instance, the RF source power can be tuned to provide higher amounts of polymer while at the same time reducing the bias power to lower the ion energy. This can lead to reduced sputtering of the microlens surface when compared to capacitively coupled plasma processes, resulting in a very smooth microlens surface. According to particular aspects, the inductively coupled plasma processing apparatus can include a grounded Faraday shield to prevent any capacitive coupling during the plasma etching process to further reduce sputtering of the microlens surface.

Figure 2:
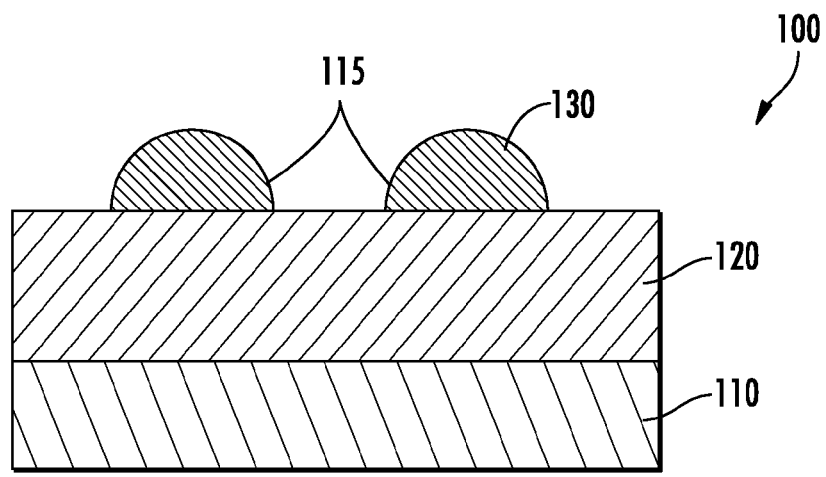
FIG. 2 depicts a cross-sectional view of an exemplary semiconductor substrate having a plurality of microlens objects formed thereon prior to modifying lens shape of the microlens objects using an inductively coupled plasma etching process according to an exemplary embodiment of the present disclosure.

FIG. 2 depicts a substrate 100 on which a plasma etching process can be performed to form microlenses according to an exemplary embodiment of the present disclosure. The substrate 100 can be formed using one or more semiconductor processing techniques, such as chemical vapor deposition (CVD) techniques and photolithography techniques. As illustrated, the substrate 100 includes a semiconductor substrate 110 on which a lens material layer 120 is formed. The lens material layer 120 can be formed on the semiconductor substrate 110 using any suitable process, such as a CVD process. The lens material layer 120 can be any suitable photo-permeable material, such as a SiN film or other suitable photo-permeable material, such as an organic photo-permeable material. As will be discussed below, microlenses can be formed in the lens material layer 120 using an inductively coupled plasma etching process to focus light onto photosensitive parts in the substrate 100.

The substrate 100 further includes a mask layer 130 formed on the lens material layer 120. The mask layer 130 can be made of, for instance, a KrF resist film, an i-line resist film, or other suitable film. The mask layer 130 can be formed on the lens material layer 120 and patterned and heat treated in a photolithography process to have a plurality of microlens objects 115 having a lens shape. As illustrated in FIG. 2, the microlens objects 115 are formed on or located in the mask layer 130 of the substrate prior to performing a plasma etching process on the substrate.

Although not illustrated for purposes of clarity and simplicity of discussion, the substrate 100 can include other suitable layers and components not illustrated in FIG. 2. For instance, the substrate can include photosensitive parts on a surface of the semiconductor substrate 110 configured to received light focused onto the photosensitive parts by microlenses. The incident light on the photolenses can be photoelectrically converted by a photodiode. The substrate 100 can further include conductive films, shading films configured to prevent light from being illuminated onto areas other than the photosensitive parts, a planarization layer, a color filter layer, and/or other suitable layers. Those of ordinary skill in the art, using the disclosures provided herein, should understand that the present disclosure is not limited to any particular structure or arrangement of the substrate 100.

Figure 3:
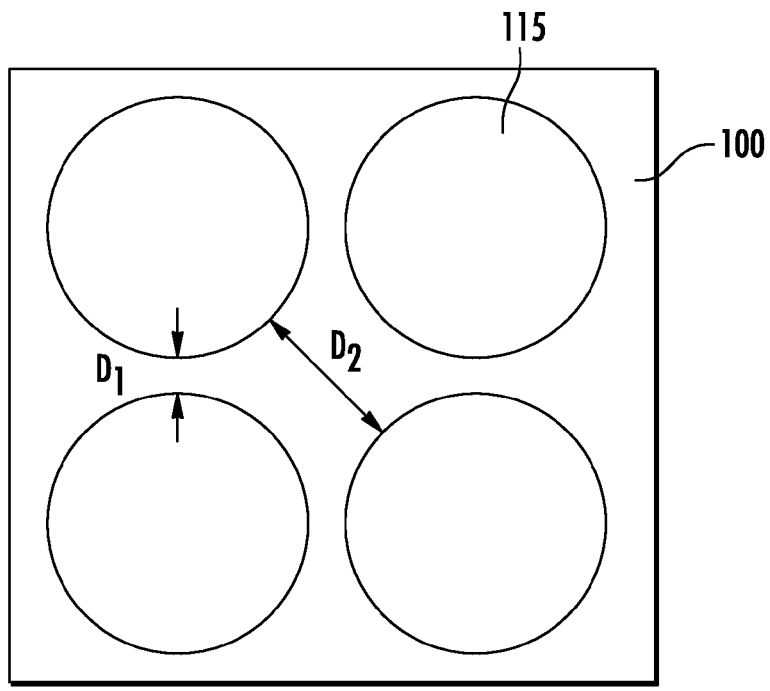
FIG. 3 depicts a top view of the exemplary semiconductor substrate depicted in FIG. 2.

FIG. 3 depicts a top view of the substrate 100 depicted in FIG. 2. As illustrated, the substrate includes a plurality of microlens objects 115 that are separated in the x-y direction by a distance $D_1$ and that are separated in the diagonal direction by a distance $D_2$. As discussed above, it is desirable to increase the light collection efficiency of the microlens objects 115 by increasing the size of the microlens objects 115 while simultaneously decreasing the distance between adjacent microlens objects 115 on the substrate 100. In particular, it is desirable to decrease the separation of the microlens objects 115 in both the x-y direction $D_1$ and in the diagonal direction $D_2$.

An inductively coupled plasma etching process can be performed on the substrate to modify the lens shape of the plurality of microlens objects 115. In particular, an inductively coupled plasma etch process can be performed in an inductively coupled plasma processing apparatus to etch the mask layer 130 and the lens material layer 120 of the substrate 100 of FIG. 2 to transcribe the microlens objects 115 to the lens material layer 120.

The process gas used during the inductively coupled plasma etching process according to exemplary embodiments of the present disclosure can include a mixture of $CF_4$ and $CHF_3$. Additional gases can be added to or included in the process gas during the plasma etching process, such as $O_2$, Ar, CO, or $N_2$. During the plasma etch process, the process gas containing $CF_4$ and $CHF_3$ can be dissociated by a substantially inductive plasma into ions and radicals that include both etching species and deposition species. The etching species can include, for instance, F radicals. The deposition species can include, for instance, polymer(s) generated during the plasma etch process. The etching species are used to etch the mask layer 130 and the lens material layer 120 such that the microlens objects 115 are transcribed into the lens material layer 120. The deposition species are deposited proximate the peripheral edge of the microlens objects 115. As a result, the lens shape of the microlens objects 115 gets larger as the etching process is performed.

Figure 4:
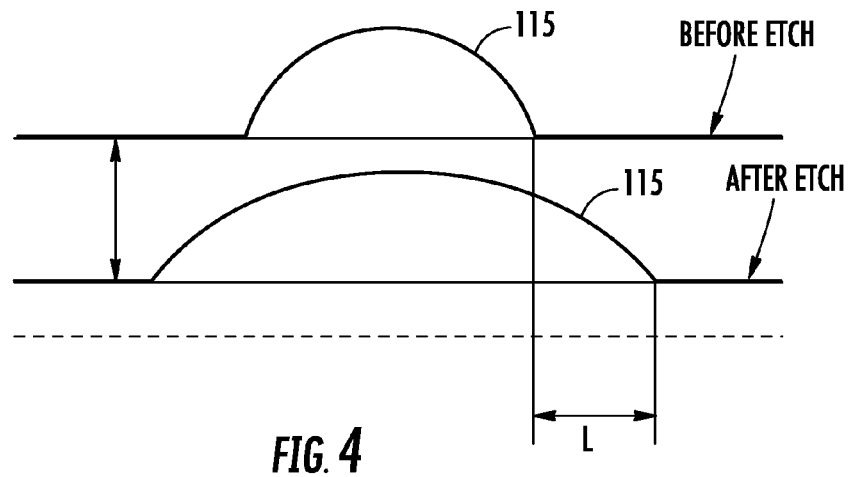
FIG. 4 depicts the modifying of the lens shape of a microlens object using an inductively coupled plasma etching process according to an exemplary embodiment of the present disclosure.

FIG. 4 depicts a graphical representation of modifying the lens shape of a microlens object using an inductively coupled plasma etching process according to an exemplary embodiment of the present disclosure. As shown, the etching process can increase the length of the microlens by a length L. Various process parameters of the etching process can be adjusted to further modify the shape of the microlens objects 115. For instance, the height, length, curvature, shape, or other parameter of the microlens objects 115 can be modified to meet required specifications for the microlens objects 115.

Figure 1B:
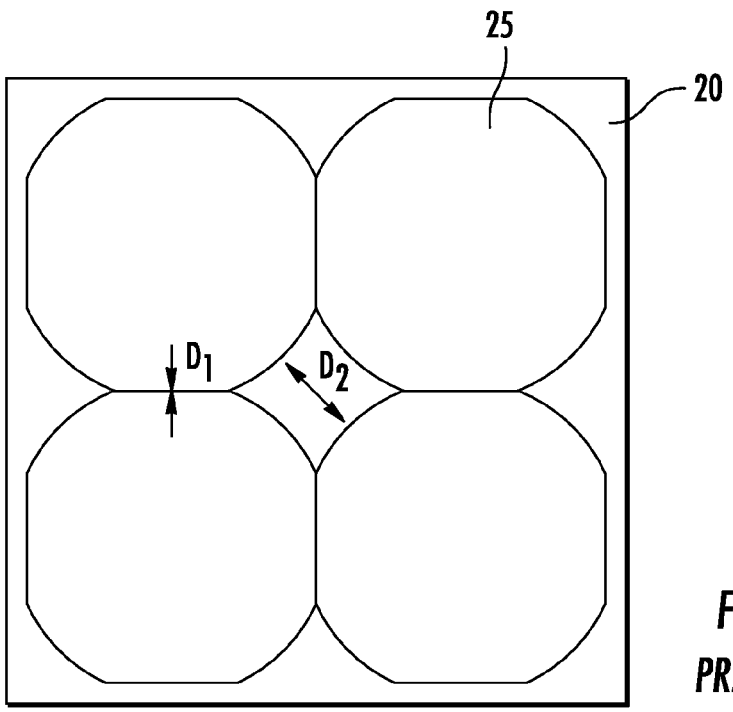
FIG. 1B depicts a top view of the exemplary microlens array of FIG. 1A after performing a reflow process.
Figure 5:
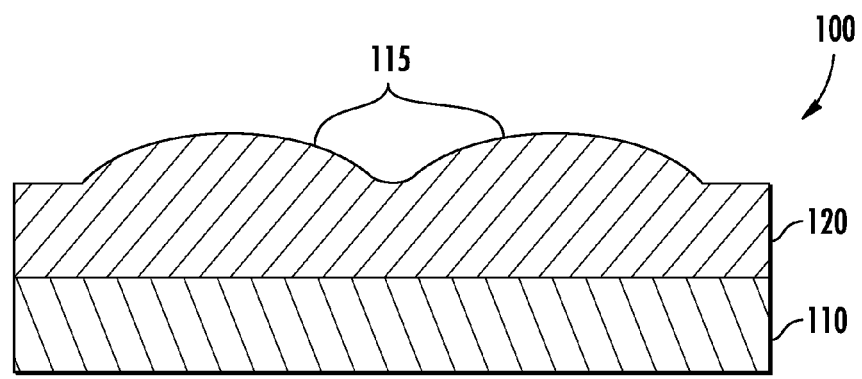
FIG. 5 depicts a cross-sectional view of an exemplary semiconductor substrate having a plurality of microlens objects having a modified lens shape as a result of an inductively coupled plasma etching process according to an exemplary embodiment of the present disclosure.
Figure 6:
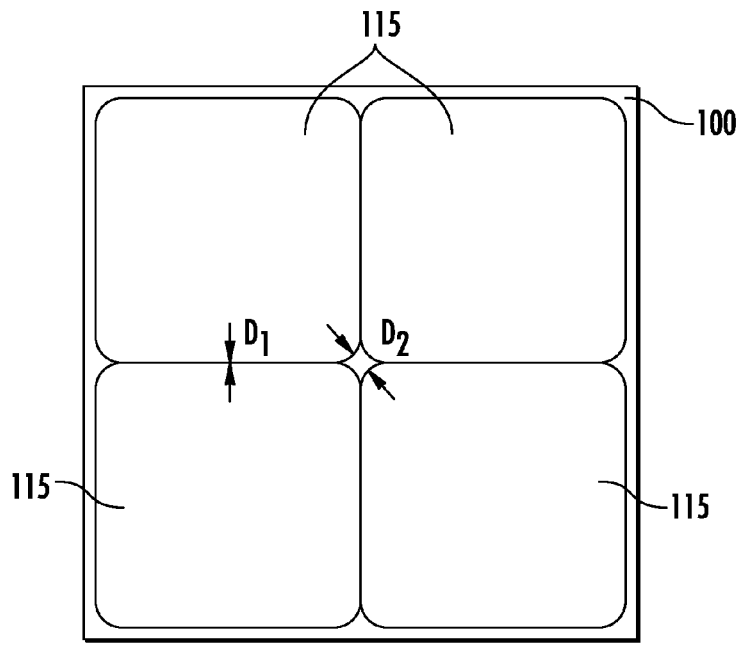
FIG. 6 depicts a top view of the exemplary semiconductor substrate depicted in FIG. 5.

FIG. 5 depicts the substrate 100 of FIG. 2 after an inductively coupled plasma etching process has been performed on the substrate 100. As shown, during the inductively coupled plasma etching process, the microlens objects 115 are transcribed to the lens material layer 120 such that microlens objects 115 are formed on the lens material layer 120. The microlens objects 115 are larger after performing the inductively coupled plasma etching process. FIG. 6 depicts a top down view of the substrate 100 of FIG. 5. As illustrated, both the x-y distance $D_1$ and the diagonal distance $D_2$ between adjacent lens objects 115 on the substrate have been decreased substantially. The diagonal distance $D_2$ is substantially reduced relative to the reduction in diagonal distance provided by a reflow process as illustrated in FIG. 1B. In this manner, the inductively coupled etching process according to aspects of the present disclosure can be used to increase the light collection efficiency of the microlens objects 115 by decreasing the distance between adjacent microlens objects 115 on the substrate.

Figure 7:
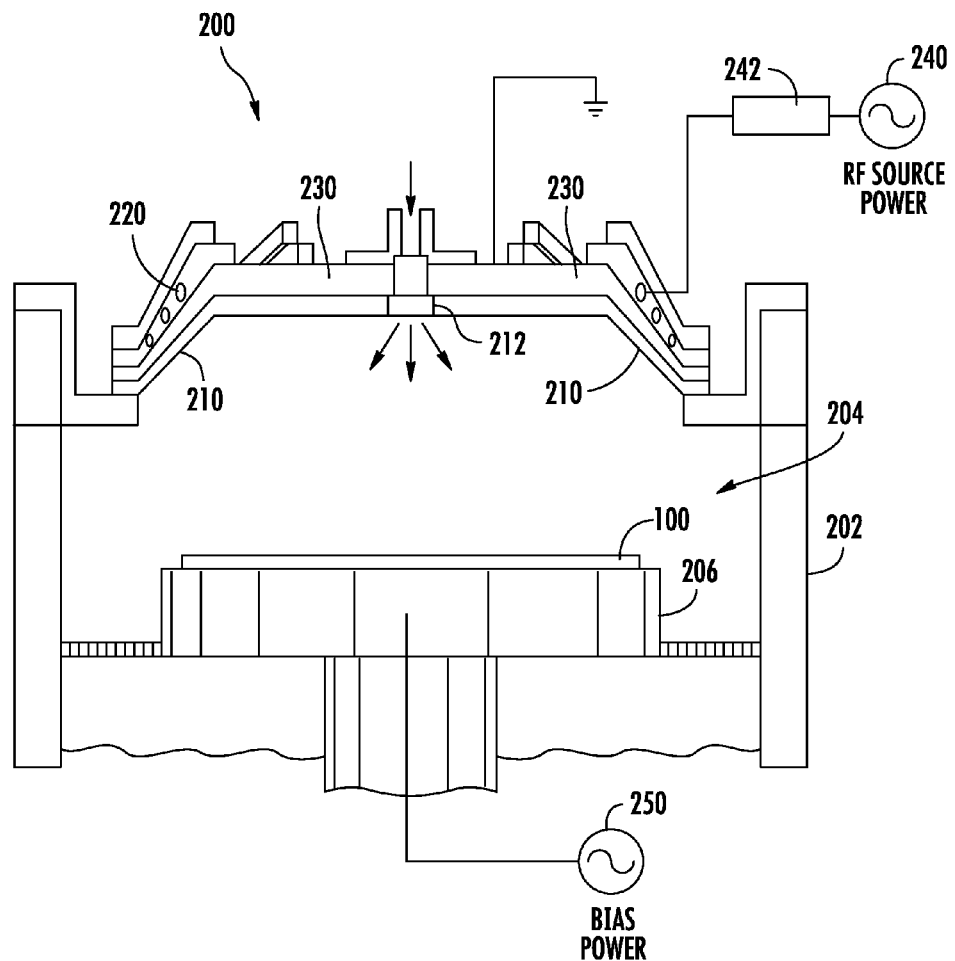
FIG. 7 depicts an exemplary inductively coupled plasma processing apparatus for performing an inductively coupled plasma etching process to modify lens shape of microlens objects on a semiconductor substrate according to an exemplary embodiment of the present disclosure.

FIG. 7 depicts an exemplary inductively coupled plasma processing apparatus 200 that can be used to perform the inductively coupled plasma etching processes according to exemplary embodiments of the present disclosure. While FIG. 7 depicts one exemplary inductively coupled plasma processing apparatus that can be used in accordance with embodiments of the present disclosure, those of ordinary skill in the art, using the disclosures provided herein, should understand that other suitable inductively coupled plasma processing reactors can be used without deviating from the scope of the present disclosure.

The plasma processing apparatus 200 includes a process chamber 202 defining an interior space 204. The process chamber 202 can be cylindrically formed and can include various tools (not illustrated) to regulate the chamber pressure within the interior space 204. Plasma etching processes are typically performed at low pressures, such as less than about 50 mTorr. The process chamber 202 can include various pressure sensors and other devices for regulating the pressure within the chamber interior 204.

A pedestal or substrate holder 206 is used to support a substrate 100 within the interior space 204. The pedestal or substrate holder 206 can include various devices, such as a focus ring and an electrostatic chuck to hold the substrate 100 during the plasma etching process. The substrate holder 206 can be fixed within the chamber interior 204 or can be configured to move up and down within the chamber interior 204. The substrate holder 204 can further include coolant paths and/or heating elements to regulate the temperature of the substrate 100 during the plasma etching process.

A dielectric window 210 is located above the substrate holder 206. The dielectric window 210 can be made of any suitable dielectric material. Preferably, the dielectric window has sufficient mechanical strength to withstand the pressure differentials created as a result of the low chamber pressure in the chamber interior 204 during plasma etch processing.

The dielectric window 210 includes a space for a showerhead 212 to feed process gas into the interior space 204. As discussed above, the process gas can include a mixture of $CF_4$ and $CHF_3$ as well as other gases. The plasma processing apparatus can also include various devices to regulate the flow of process gas into the process chamber interior 204. For instance, the devices can regulate the flow of $CF_4$ and $CHF_3$ into the process chamber interior 204 during the plasma etch process. As discussed below, the flow rates of $CF_4$ and $CHF_3$ can be selected to reduce the distance between adjacent microlens objects on a substrate.

The plasma processing apparatus 200 further includes at least one inductive element 220 for generating an inductive plasma in the interior space 204. The inductive element 220 can include a coil or antenna element that when supplied with RF power, induces a plasma in the process gas in the interior space 204 of plasma processing apparatus 100. An RF source 240 can be configured to provide RF power to the inductive element 220 through a suitable matching network 242. In addition, a bias source 250 can be configured to provide bias power to the plasma processing apparatus 200.

The RF source 240 and the bias source 250 can be controlled to provide for independent control of ion energy and ion density in the inductive plasma generated in the process chamber interior 206. For example, the RF source 240 can be tuned to provide higher amounts of polymer during the plasma etching process while the bias source 250 is controlled to reduce the ion energy. This can lead to reduced sputtering of the surface of microlens objects during the plasma etching processing, resulting in a smoother microlens surfaces.

The plasma processing apparatus 200 further includes a Faraday shield 230 disposed between the inductive element 220 and the process chamber interior 206. In particular, the Faraday shield 230 is disposed between the inductive element 220 and the dielectric window 210. As illustrated, the Faraday shield 230 is grounded to prevent capacitive coupling during the plasma etching process. This provides for even improved independent control of ion density and ion energy and can lead to even reduced sputtering of the microlens surface during the plasma etching process, improving the light collection efficiency of the microlens objects.

Figure 8:
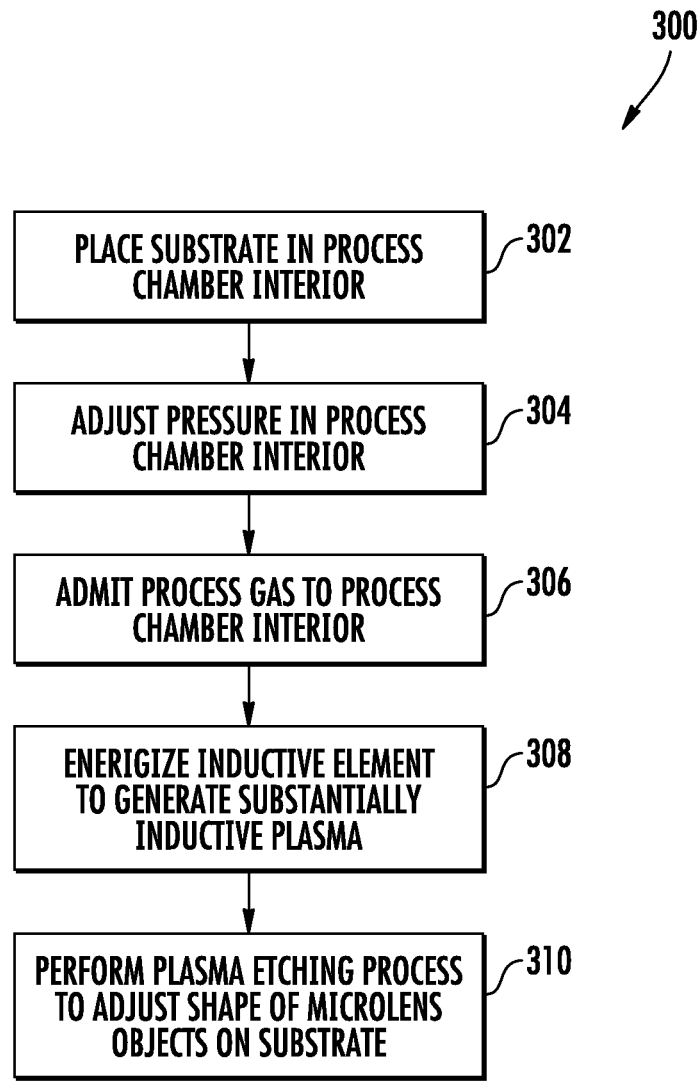
FIG. 8 depicts a flow diagram of an exemplary method of forming microlenses on a substrate according to an exemplary embodiment of the present disclosure.

FIG. 8 depicts a flow chart of an exemplary method 300 for forming microlenses according to an exemplary embodiment of the present disclosure. The method of FIG. 8 can be implemented using any suitable inductively coupled plasma processing apparatus, such as the inductively coupled plasma processing apparatus 200 depicted in FIG. 7. In addition, although FIG. 8 depicts steps performed in a particular order for purposes of illustration and discussion, the methods discussed herein are not limited to any particular order or arrangement. One skilled in the art, using the disclosures provided herein, will appreciate that various steps of the methods can be omitted, rearranged, combined and/or adapted in various ways.

At (302), the method can include placing a substrate in a process chamber interior of an inductively coupled plasma processing apparatus. For instance, a substrate having a lens material layer and a mask layer can be placed on the substrate holder of the inductively coupled plasma process apparatus. The mask layer can include a plurality of microlens objects having a lens shape. The substrate can be formed using any suitable semiconductor processing techniques, such as one or more CVD processing techniques and/or photolithography techniques.

At (304), the pressure in the interior of the processing chamber can be adjusted to a desired level. For instance, air and/or other gases in the processing chamber interior can be evacuated from the process chamber interior to achieve a desired chamber pressure for the inductively coupled plasma etch process. The pressure in the chamber can be selected according to a process recipe or adjusted during the plasma etch process to achieve a desired microlens shape and a desired spacing between adjacent microlens objects. In a particular implementation, the pressure in the chamber can be selected to be in the range of 5 mTorr to 50 mTorr.

A process gas is admitted into the interior of the processing chamber at (306). As discussed above, the process gas can be a simple process gas, such as a mixture of $CF_4$ and $CHF_3$. The process gas can further include additional gases, such as one or more of $O_2$, Ar, CO, or $N_2$. Similar to the pressure in the process chamber interior, the flow rates of the process gas, such as the flow rates of $CF_4$ and $CHF_3$, can be selected according to a process recipe or adjusted during the plasma etch process to achieve a desired microlens shape and spacing between adjacent microlenses. For example, the flow rate of $CF_4$ can be in the range of 10 sccm to 80 sccm. The flow rate of $CHF_3$ can be in the range of 120 sccm to 300 sccm.

At (308) the method includes energizing at least one inductive element to generate a substantially inductive plasma within the interior of the process chamber. In particular, an RF source power can be provided to the inductive element to generate an inductive plasma within the chamber interior. A bias power can also be provided from a bias source to the plasma processing apparatus. The RF source power and the bias power can be selected to provide independent control of ion density and ion energy during the plasma etching process. For instance, RF source power can be selected to produce higher amounts of polymer while the bias power can be selected to reduce ion energy. In a particular implementation, the RF source power can be in the range of 600 W to 2500 W while the bias power can be in the range of 50 W to 250 W.

At (310), a plasma etching process is performed using the substantially inductive plasma to modify the lens shape of the microlens objects. In particular, the plasma etching process can transcribe microlens objects having a lens shape formed on a mask layer of the substrate to a lens material layer of the substrate. During the etching process, the microlens objects can be increased in size by reducing the distance, such as the x-y distance and the diagonal distance, between adjacent microlens objects on the substrate.

Various process parameters of the plasma etching process, such as chamber pressure, process gas flow rates, RF source and bias power, and other parameters can be selected to achieve a desired lens shape and desired distance between adjacent lens on the substrate. In one example, a plasma etching process can be performed to modify the microlens shape of microlens objects on a substrate based on the process parameters set forth in the following table.

TABLE 1

Exemplary Process Parameters

| | Process Parameter | | | | |
|---|---|---|---|---|---|
| | Pressure | Source Power | Bias Power | $CF_4$ Flow Rate | $CHF_3$ Flow Rate |
| Value | 15 mTorr | 1200 W | 125 W | 10 sccm | 300 sccm |

The process parameters set forth in Table 1 provide exemplary processing parameters for a specific exemplary inductively coupled plasma etch process. Those of ordinary skill in the art, using the disclosures provided herein, should understand that various different processing parameters can be used depending on the structure of the substrate, the desired microlens shape, the desired processing time, the desired distance between adjacent microlens, and other factors.

FIG. 9 depicts the trends of changes in etching rate and distance between microlens objects at varying process parameter values for an inductively coupled plasma etching process according to exemplary embodiments of the present disclosure. The process parameters depicted in FIG. 9 include bias power, source power, chamber pressure, $CF_4$ flow rate (holding the $CHF_3$ constant), $CHF_3$ flow rate (holding the $CF_4$ flow rate constant), electrostatic chuck temperature (substrate holder temperature), and CO flow rate.

For the case of etching rate, an arrow pointing upwards indicates an increase in etching rate. An arrow pointing downward indicates a decrease in etching rate. For the case of open area size, an arrow pointing upwards indicates an increase in the distance between adjacent microlenses and an arrow pointing downwards indicates a decrease in the distance between adjacent microlenses. The table illustrates trends for increasing parameter values. Trends for decreasing parameter values can be derived by reversing the arrows depicted in FIG. 9.

For example, as depicted in FIG. 9 as the flow rate of $CHF_3$ is increased (with the flow rate of $CF_4$ being held constant), the etch rate decreases and the distance between adjacent microlens objects on the substrate decreases. As another example, as the flow rate of $CF_4$ decreases (with the flow rate of $CHF_3$ being held constant), the etch rate decreases and the distance between adjacent microlens objects on the substrate decreases. As yet another example, as the bias power is decreases, the etching rate decreases and the distance between adjacent microlens objects on the substrate decreases.

Figure 10:
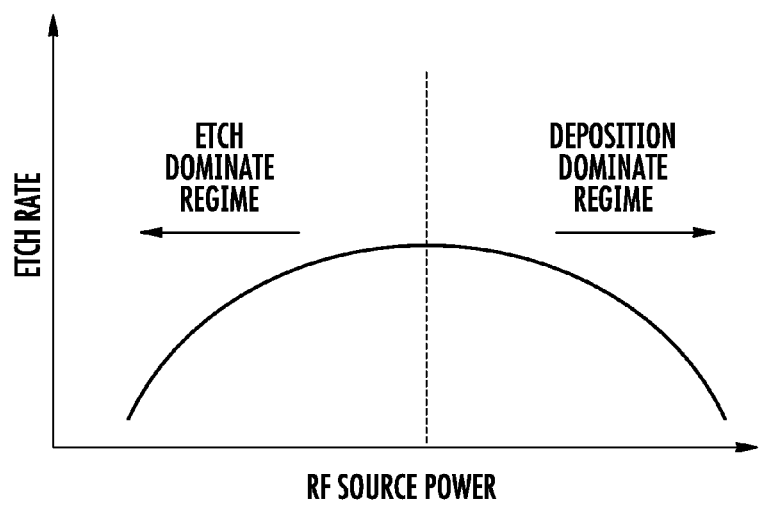
FIG. 10 depicts a graphical representation of differing modes of operation for an exemplary plasma process.

As illustrated in FIG. 9, changes in the source power can have differing effects on the etch rate depending on the regime or mode in which the plasma process is being performed. FIG. 10 provides a graphical representation of the different regimes for a plasma process. More particularly, FIG. 10 plots etch rate as a function of RF source power. As illustrated, increasing the RF source power will increase the etch rate until it reaches a peak value. Once the peak value is reached, further increasing the RF source power will result in a decrease in the etch rate. The plasma process is considered to be in an etch dominate regime or mode when the etch rate increases with RF source power. The plasma process is considered to be in a deposition dominate regime or mode when the etch rate decreases with RF source power.

As shown in FIG. 9, when the plasma process is in the etch dominate regime, increasing the RF source power can result in an increase in etch rate and a decrease in distance between adjacent microlens objects in the substrate. This is in contrast to many plasma etch processing techniques using $CF_4$ process gas mixtures known in the art, such as capacitively coupled plasma etch processing techniques, which typically involve a tradeoff between etch rate and distance between adjacent microlenses. Without being bound to any particularly theory of operation, this can be at least partially due to the increased independent control of ion density and ion energy provided by using an inductively coupled plasma etching process.

The methods of forming microlenses on a semiconductor substrate provided herein can provide for the reduced distance between adjacent microlenses using a simple process gas, such as a process gas that includes a mixture of $CF_4$ and $CHF_3$. The inductively coupled plasma etch process can modify the lens shape of a plurality of microlens objects located on a semiconductor substrate to meet microlens specifications in terms of curvature, height, length, shape, and/or distance between adjacent microlens objects on the substrate The use of an inductively coupled plasma processing tool with a grounded Faraday shield can prevent capacitive coupling leading to reduced sputtering of the microlens objects and a smoother microlens surface.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method of forming microlenses on a substrate, comprising:
   placing a substrate having a plurality of microlens objects having a lens shape within the interior of a processing chamber of an inductively coupled plasma processing apparatus, the inductively coupled plasma processing apparatus comprising at least one inductive element and a grounded Faraday shield disposed between the inductive element and the interior of the process chamber;
   providing a process gas to the interior of the processing chamber, the process gas comprising a mixture of $CF_4$ and $CHF_3$;
   energizing the at least one inductive element to generate a substantially inductive plasma within the interior of the processing chamber; and
   performing a plasma etching process with the process gas on the substrate to modify the lens shape of the microlens objects on the substrate.

2. The method of claim 1, wherein the process gas further comprises one or more of $O_2$, Ar, CO, or $N_2$.

3. The method of claim 1, wherein performing the plasma etching process reduces the distance between adjacent microlens objects on the substrate.

4. The method of claim 3, wherein performing the plasma etching process reduces the diagonal distance between adjacent microlens objects on the substrate.

5. The method of claim 1, wherein the substrate comprises a lens material layer and a mask layer, the microlens objects being initially located on the mask layer prior to performing the plasma etching process, the plasma etching process transcribing the lens shape of the microlens objects located on the mask layer to the lens material layer such that the plurality of microlens objects are located on the lens material layer after the plasma etching process.

6. The method of claim 1, wherein providing a process gas to the interior of the processing chamber comprises decreasing a flow rate of $CF_4$ to reduce the distance between adjacent microlens objects on the substrate.

7. The method of claim 1, wherein providing a process gas to the interior of the process chamber comprises increasing a flow rate of $CHF_3$ to reduce the distance between adjacent microlens objects on the substrate.

8. The method of claim 1, wherein the inductively coupled plasma processing apparatus comprises an RF energy source configured to provide RF source power to the at least one inductive element and a bias energy source configured to provide bias power to the inductively coupled plasma processing apparatus.

9. The method of claim 8, wherein the method comprises decreasing the bias power provided by the bias energy source to reduce the distance between adjacent microlens objects on the substrate.

10. The method of claim 8, wherein energizing the at least one inductive element comprises providing RF power from the RF energy source to the at least one inductive element such that the plasma etching process is performed in an etch dominate regime.

11. The method of claim 10, wherein the method comprises increasing the RF power provided to the at least one inductive element to reduce the distance between adjacent microlens objects on the substrate and to increase an etch rate associated with the plasma etching process.

12. A method of forming microlenses on a semiconductor substrate, the method comprising:
    performing an inductively coupled plasma etching process using a process gas in the interior of a processing chamber of an inductively coupled plasma processing apparatus on a substrate, the substrate comprising a lens material layer and a mask layer, the substrate comprising a plurality microlens objects having a lens shape formed on the mask layer, the inductively coupled plasma etching process transcribing the lens shape of the microlens objects formed on the mask layer to the lens material layer such that the plurality of microlens objects are formed on the lens material layer;
    wherein the process gas comprises a mixture of $CF_4$ and $CHF_3$;
    wherein the inductive coupled plasma processing apparatus comprises at least one inductive element and a grounded Faraday shield disposed between the at least one inductive element and the interior of the processing chamber.

13. The method of claim 12, wherein the process gas further comprises one or more of $O_2$, Ar, CO, or $N_2$.

14. The method of claim 12, wherein the inductively coupled plasma etching process reduces the distance between adjacent microlens objects on the substrate.

15. The method of claim 14, wherein the inductively coupled plasma etching process reduces the diagonal distance between adjacent microlens objects on the substrate.

16. The method of claim 12, wherein the method comprises adjusting flow rates of $CF_4$ and $CHF_3$ to reduce the distance between adjacent microlens objects on the substrate during the inductively coupled plasma etching process.

17. The method of claim 1, wherein the inductively coupled plasma processing apparatus comprises an RF energy source configured to provide RF source power to the at least one inductive element and a bias energy source configured to provide bias power to the inductively coupled plasma processing apparatus.

18. The method of claim 17, wherein the method comprises decreasing the bias power provided by the bias energy source to reduce the distance between adjacent microlens objects on the substrate.

19. The method of claim 17, wherein the method comprises providing RF power from the RF energy source to the at least one inductive element such that the inductively coupled plasma etching process is performed in an etch dominate regime.

20. The method of claim 19, wherein the method comprises increasing the RF power provided to the at least one inductive element to reduce the distance between adjacent microlens objects on the substrate and to increase an etch rate associated with the inductively coupled plasma etching process.

* * * * *